(12) United States Patent
Li et al.

(10) Patent No.: US 9,442,230 B2
(45) Date of Patent: Sep. 13, 2016

(54) SUB-WAVELENGTH EXTREME ULTRAVIOLET METAL TRANSMISSION GRATING AND MANUFACTURING METHOD THEREOF

(71) Applicant: INSTITUTE OF MICROELECTRONICS, CHINESE ACADEMY OF SCIENCES, Beijing (CN)

(72) Inventors: Hailiang Li, Beijing (CN); Changqing Xie, Beijing (CN); Ming Liu, Beijing (CN); Dongmei Li, Beijing (CN); Lina Shi, Beijing (CN); Xiaoli Zhu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 446 days.

(21) Appl. No.: 14/144,222

(22) Filed: Dec. 30, 2013

(65) Prior Publication Data
US 2014/0177039 A1    Jun. 26, 2014

Related U.S. Application Data

(63) Continuation of application No. PCT/CN2011/079850, filed on Sep. 20, 2011.

(51) Int. Cl.
*G06K 7/10* (2006.01)
*G02B 5/18* (2006.01)
(Continued)

(52) U.S. Cl.
CPC .......... *G02B 5/1871* (2013.01); *G02B 5/1809* (2013.01); *G02B 5/1838* (2013.01);
(Continued)

(58) Field of Classification Search
CPC   G02B 5/1809; G02B 5/1838; G02B 5/1857; G02B 5/1871; G02B 5/18; G02B 2005/1804; G03F 7/0757; G03F 7/2059; G03F 7/40
USPC ....... 359/350, 359, 360, 361, 558, 566, 569, 359/570, 574, 575, 576; 378/145, 154, 155, 378/156, 157, 158, 159, 161; 355/67, 71; 427/160, 162, 163.1, 164, 165, 166, 427/168, 169
See application file for complete search history.

(56) References Cited

U.S. PATENT DOCUMENTS

2010/0284064 A1* 11/2010 Kruizinga ............ G02B 5/1838
359/359
2012/0161600 A1*  6/2012 Norris ................... B81C 99/009
313/11

FOREIGN PATENT DOCUMENTS

CN          1790067 A      6/2006
CN        100501461 C      6/2007
(Continued)

OTHER PUBLICATIONS

Dolan, et al., Canyon Lithography, IEEE Electron Device Letters, Jun. 1983, vol. EDL-4, No. 6, pp. 178-180.
International Search Report and Written Opinion dated Jun. 7, 2012, issued in International Application No. PCT/CN2011/079850, filed on Sep. 20, 2011.

*Primary Examiner* — Scott J Sugarman
*Assistant Examiner* — Mustak Choudhury
(74) *Attorney, Agent, or Firm* — Knobbe, Martens, Olson & Bear, LLP

(57) ABSTRACT

A method of manufacturing a sub-wavelength extreme ultraviolet metal transmission grating is disclosed. In one aspect, the method comprises forming a silicon nitride self-supporting film window on a back surface of a silicon-based substrate having both surfaces polished, then spin-coating a silicon nitride film on a front surface of the substrate with an electron beam resist HSQ. Then, performing electron beam direct writing exposure on the HSQ, developing and fixing to form a plurality of grating line patterns and a ring pattern surrounding the grating line patterns. Then depositing a chrome material on the front surface of the substrate through magnetron sputtering. Then, removing the chrome material inside the ring pattern. Then, growing a gold material on the front surface of the substrate through atomic layer deposition. Lastly, removing the gold material on the chrome material outside the ring pattern as well as on and between the grating line patterns, thereby only retaining the gold material on sidewalls of the grating line patterns.

19 Claims, 3 Drawing Sheets

(51) Int. Cl.
  *G03F 7/075* (2006.01)
  *G03F 7/20* (2006.01)
  *G03F 7/40* (2006.01)

(52) U.S. Cl.
  CPC ..... *G02B5/1857* (2013.01); *G02B 2005/1804* (2013.01); *G03F 7/0757* (2013.01); *G03F 7/2059* (2013.01); *G03F 7/40* (2013.01)

(56) References Cited

FOREIGN PATENT DOCUMENTS

| CN | 101903808 A | 12/2010 |
| WO | WO 2004/031861 A2 | 4/2004 |
| WO | WO 2009/061861 A2 | 5/2009 |

\* cited by examiner

SUB-WAVELENGTH EXTREME ULTRAVIOLET METAL TRANSMISSION GRATING AND MANUFACTURING METHOD THEREOF

RELATED APPLICATIONS

This application claims priority to International Application No. PCT/CN2011/079850, filed on Sep. 20, 2011, entitled "SUB-WAVELENGTH EXTREME ULTRAVIOLET METAL TRANSMISSION GRATING AND MANUFACTURING METHOD THEREOF," which is incorporated herein by reference in its entirety.

BACKGROUND

1. Field

The disclosed technology relates to micro-optical metal transmission grating technology, and particularly to a sub-wavelength extreme ultraviolet metal transmission grating and manufacturing method thereof.

2. Description of the Related Technology

Transmission gratings are widely used as high-resolution chromatic dispersion optical elements due to advantages of simple structure, wide optical spectrum, smooth energy response, and flat spectrum surface, etc. The transmission gratings can be combined conveniently with temporal or spatial analysis equipments to constitute measurement systems capable of diagnosing temporal and spatial energy spectrum characteristics of plasma simultaneously. As a result, the transmission gratings have extensive usage in astrophysics and inertia-constraint nuclear fusion. Sub-wavelength metal transmission gratings as one kind of the transmission gratings play an important role in the aforementioned applications.

Diffraction and diffusion may occur when light wave is incident on a surface of a metal film having periodically-arranged sub-wavelength apertures, generating a transient field at the surface of the metal film. The transient field is effectively amplified at the incident surface by plasmon near-field enhancement effect and then transmitted to an exit surface through the sub-wavelength apertures. The transient field is amplified again at the exit surface by the plasmon near-field enhancement effect, resulting in far-field enhancement effect. This phenomenon is called ultra-strong transmission. Accordingly, metal transmission gratings having a period in a wavelength order as a simplified model of micro-nano structures of metal have been proposed as a basic structure for studying interaction between light and periodic metal structures. It has been proved theoretically that the transmission enchantment effect also exists for the metal transmission gratings. However, diffraction efficiency is extremely low for metal transmission gratings in the extreme ultraviolet waveband. Thus, it is meaningful if the transmission enchantment effect can be applied to the metal transmission gratings in the extreme ultraviolet waveband.

However, current study of the sub-wavelength metal transmission gratings mainly focuses on visible waveband and near-infrared waveband. Such metal gratings have a relatively large period and thus are simple in structure and easy for manufacture and analysis. For the extreme ultraviolet waveband, however, the metal transmission gratings need to have a period near or even less than the wavelength and a duty cycle of 1:1. It is very difficult to manufacture such metal transmission gratings. When resist patterns are written directly using an electron beam, the resist is prone to collapse due to proximity effect and back-scattering. Moreover, it is difficult to obtain a desired thickness of the resist, thereby limiting an aspect ratio of the metal grating. This becomes an obstacle in implementing desirable phase and amplitude modulation of light.

In order to address the various problems in the prior art, the disclosed technology provides a sub-wavelength extreme ultraviolet metal transmission grating and manufacturing method thereof.

SUMMARY OF CERTAIN INVENTIVE ASPECTS

In view of the above-described problems in the art, the disclosed technology includes a sub-wavelength extreme ultraviolet metal transmission grating and manufacturing method thereof in order to enable the transmission enchantment effect for the sub-wavelength metal transmission gratings in the extreme ultraviolet waveband. Embodiments of the disclosed technology address the problem of resist collapse caused by the proximity effect and back-scattering in manufacturing high linear-density metal transmission gratings having a duty cycle of 1:1 and achieve a desirable resist thickness. The metal transmission grating implements simultaneous modulation of phase and amplitude of incident light in the extreme ultraviolet waveband.

According to an aspect of the disclosed technology, there is provided a method for manufacturing a sub-wavelength extreme ultraviolet metal transmission grating, comprising: forming a silicon nitride self-supporting film window on a back surface of a silicon-based substrate having both surfaces polished; spin-coating a silicon nitride film on a front surface of the silicon-based substrate with an electron beam resist (HSQ); performing electron beam direct writing exposure on the HSQ, and then performing developing and fixing to form a plurality of grating line patterns having a duty cycle of 1:3 and a ring pattern surrounding the grating line patterns; depositing a chrome material on the front surface of the silicon-based substrate through magnetron sputtering as a light-blocking layer for the grating line patterns and the ring pattern; removing the chrome material inside the ring pattern so that only the chrome material outside the ring pattern is retained as a absorber of scattering light; growing a gold material on the front surface of the silicon-based substrate through atomic layer deposition; and removing the gold material on the chrome material outside the ring pattern, between the grating line patterns, and on the grating line patterns so that only the gold material on sidewalls of the grating line patterns is retained.

Optionally, forming the silicon nitride self-supporting film window on the back surface of the silicon-based substrate having both surfaces polished comprises: growing a silicon nitride film on each of the front surface and the back surface of the silicon-based substrate; forming a window by etching the silicon nitride film on the back surface of the silicon-based substrate until the silicon-based substrate is exposed; forming the silicon nitride self-supporting film window by anisotropic etching of silicon inside the window until the silicon nitride film on the front surface of the silicon-based substrate is exposed.

According to another aspect of the disclosed technology, there is provided a sub-wavelength extreme ultraviolet metal transmission grating, comprising: a silicon-based substrate; a silicon nitride self-supporting film window supported by the silicon-based substrate; a plurality of grating line patterns having a duty cycle of 1:3 and being configured for phase modulation of incident light and a ring pattern surrounding the plurality of grating line patterns, the plurality of grating line patterns and the ring pattern being arranged on the silicon nitride self-supporting film window; a gold material for amplitude modulation of the incident light formed on the silicon nitride self-supporting film window and arranged on respective sidewalls of the grating line patterns and the ring pattern; and a chrome material arranged outside the ring pattern on the silicon nitride self-supporting film window.

Optionally, the silicon nitride self-supporting film window is formed by: growing a silicon nitride film on each of a front surface and a back surface of the silicon-based substrate; forming a window by etching the silicon nitride film on the back surface of the silicon-based substrate until the silicon-based substrate is exposed; and forming the silicon nitride self-supporting film window by anisotropic etching of silicon inside the window until the silicon nitride film on the front surface of the silicon-based substrate is exposed.

Embodiments of the disclosed technology achieve the following advantages:

According to the sub-wavelength extreme ultraviolet metal transmission grating and manufacturing method thereof, patterns are directly written on the silicon nitride film window using the electron beam. In this way, the back-scattering between the electron beam and the substrate can be reduced effectively so as to obtain steep line patterns. The grating line patterns has a duty cycle of 1:3 instead of 1:1 such that the grating line patterns are not prone to collapse, thereby reducing processing difficulty and meanwhile addressing problems of low resolution and resist collapse caused by the proximity effect.

According to the sub-wavelength extreme ultraviolet metal transmission grating and manufacturing method thereof, the structure obtained may have a period near or less than the extreme ultraviolet wavelength. As a result, transmission ratio may be enhanced by the transmission enhancement effect.

According to the sub-wavelength extreme ultraviolet metal transmission grating and manufacturing method thereof, the grating may perform amplitude and phase modulation of the incident light simultaneously. The phase of the incident light may be modulated by adjusting a thickness d of the resist HSQ according to a waveband in which the grating is to be used. A relationship between an optical path difference and a phase difference is represented by: $\Delta\phi=(2\pi/\lambda)\times d$, wherein $\Delta\phi$ is the phase difference, $\lambda$ is the wavelength of the incident light, and d is the thickness of the HSQ through which the incident light has passed. The gold material on the sidewalls of the HSQ may perform amplitude modulation of the incident light.

In conventional processes, the grating line patterns have a duty cycle of 1:1, which is difficult to implement. The grating line patterns according to the disclosed technology have a duty cycle of 1:3, which is easy to implement.

DETAILED DESCRIPTION OF CERTAIN ILLUSTRATIVE EMBODIMENTS

Next, the disclosed technology will be explained in detail in connection with specific embodiments with references to accompanied drawings, such that objects, solutions, and advantages of the disclosed technology will become apparent.

Figure 1:
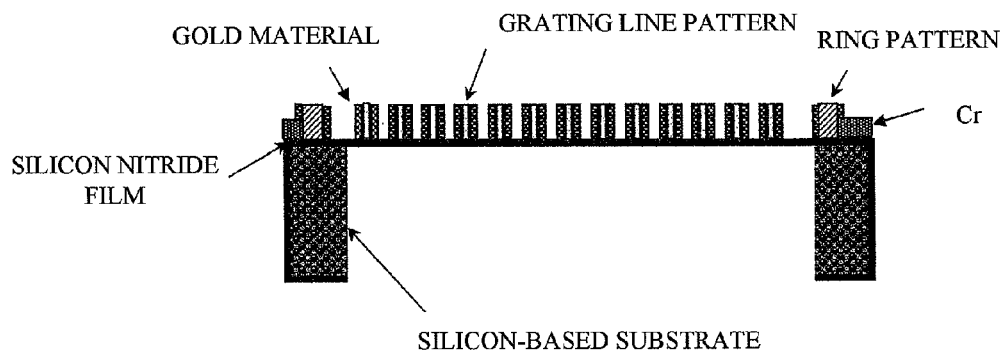
FIG. 1 schematically shows a sectional view of a sub-wavelength extreme ultraviolet metal transmission grating according to an embodiment of the disclosed technology.
Figure 2:
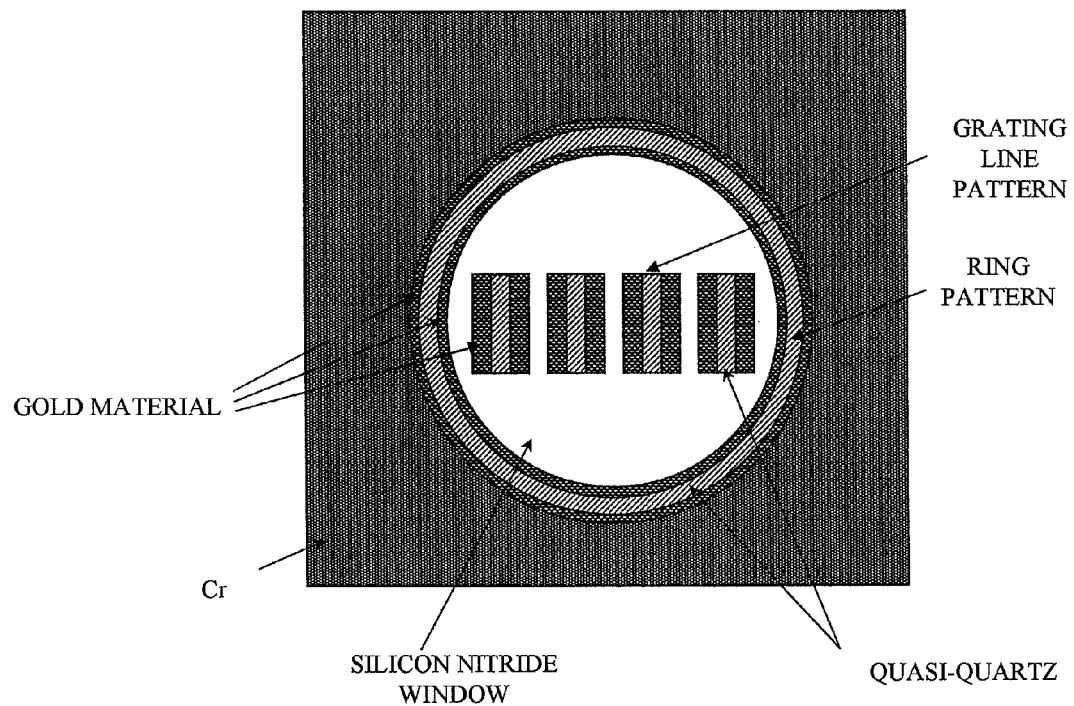
FIG. 2 schematically shows a plan view of a sub-wavelength extreme ultraviolet metal transmission grating according to an embodiment of the disclosed technology.

FIG. 1 schematically shows a sectional view of a sub-wavelength extreme ultraviolet metal transmission grating according to an embodiment of the disclosed technology. FIG. 2 schematically shows a plan view of a sub-wavelength extreme ultraviolet metal transmission grating according to an embodiment of the disclosed technology. The sub-wavelength extreme ultraviolet metal transmission grating comprises: a silicon-based substrate; a silicon nitride self-supporting film window supported by the silicon-based substrate; a plurality of grating line patterns configured for phase modulation of incident light and a ring pattern surrounding the plurality of grating line patterns, the plurality of grating line patterns and the ring pattern being arranged on the silicon nitride self-supporting film window; a gold material for amplitude modulation of the incident light formed on the silicon nitride self-supporting film window and arranged on respective sidewalls of the grating line patterns and the ring pattern; and a chrome material arranged outside the ring pattern on the silicon nitride self-supporting film window.

The grating line patterns may have a duty cycle of 1:3 instead of 1:1, so that the grating line patterns are separated by a relatively large spacing, thereby reducing the proximity effect when the grating line patterns are directly written by an electron beam. As a result, problems of low resolution and HSQ collapse caused by the proximity effect can be effectively addressed. Furthermore, the electron beam almost passes through the silicon nitride film window entirely so that the back-scattering is also reduced. Thus, it is possible to obtain steep grating line patterns that are not prone to collapse. The structure thus obtained may have a period near or less than the extreme ultraviolet wavelength and therefore may effectively enhance transmission rate by the transmission enhancement effect.

According to the embodiment, a phase of the incident light may be modulated by adjusting a thickness d of the resist HSQ according to a waveband in which the grating is to be used. A relationship between an optical path difference and a phase difference is represented by: $\Delta\phi=(2\pi/\lambda)\times d$, wherein $\Delta\phi$ is the phase difference, $\lambda$ is the wavelength of the incident light, and d is the thickness of the HSQ through which the incident light has passed. The gold material on the sidewalls of the HSQ may perform amplitude modulation of the incident light. The sub-wavelength extreme ultraviolet metal transmission grating thus may perform amplitude and phase modulation of the incident light simultaneously.

Figure 3:
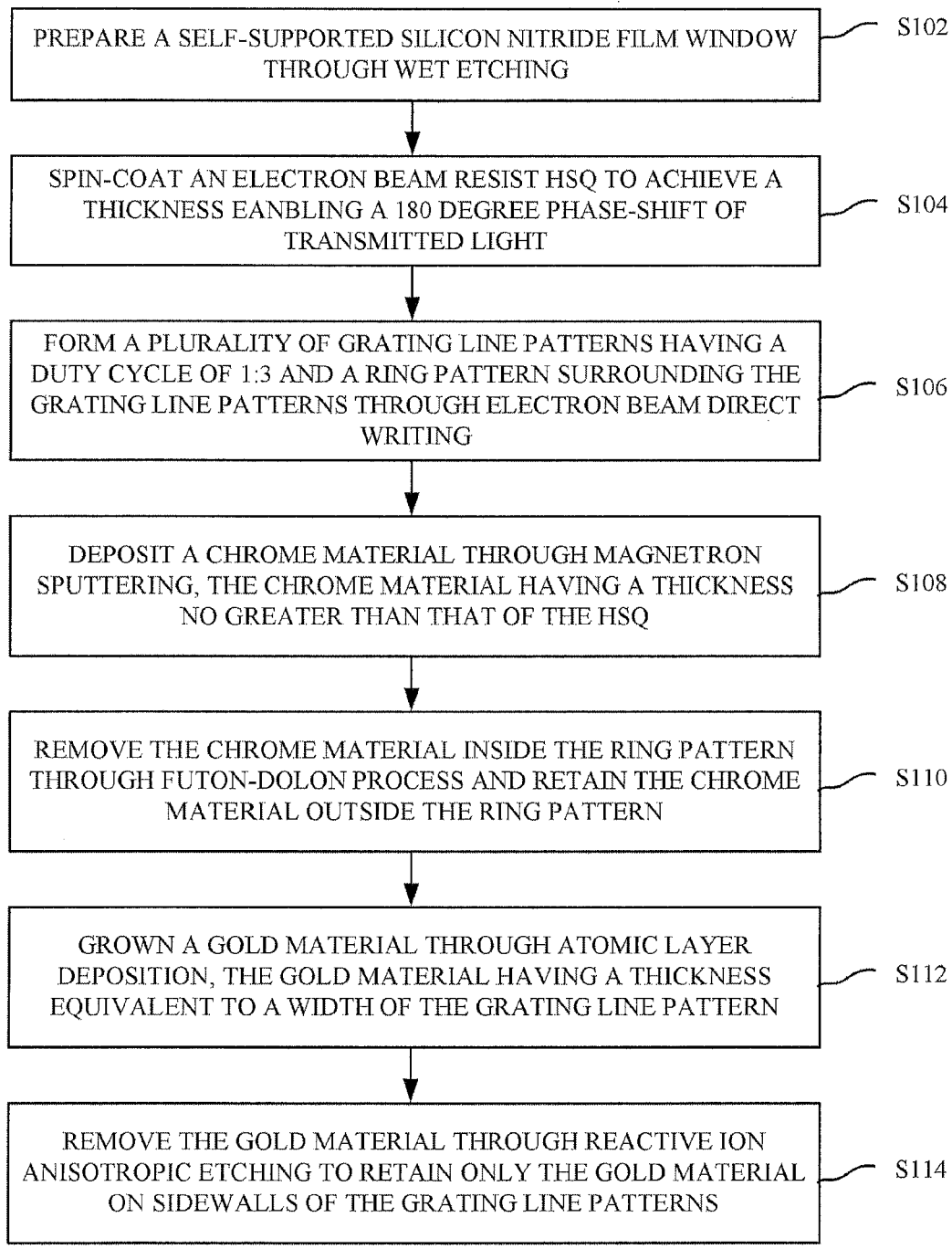
FIG. 3 schematically shows a method flow diagram of a method for manufacturing a sub-wavelength extreme ultraviolet metal transmission grating according to an embodiment of the disclosed technology.

FIG. 3 schematically shows a method flow diagram of a method for manufacturing a sub-wavelength extreme ultraviolet metal transmission grating according to an embodiment of the disclosed technology. The method comprises the following steps.

In step S102, a silicon nitride self-supporting film window is prepared on a back surface of a silicon-based substrate having both surface polished through wet etching.

In step S104, a silicon nitride film on a front surface of the silicon-based substrate is spin-coated with an electron beam resist HSQ (Hydrogen silsesquioxane). The HSQ changes, after being subjected to electron beam direct writing, to a quasi-quartz structure, which has many excellent characteristics such as high resolution, small edge roughness, and good mechanical performance, etc. A phase of the incident light may be modulated by adjusting a thickness d of the resist HSQ according to a waveband in which the grating is to be used. A relationship between an optical path difference and a phase difference is represented by: $\Delta\phi=(2\pi/\lambda)\times d$, wherein $\Delta\phi$ is the phase difference, $\lambda$ is the wavelength of the incident light, and d is the thickness of the HSQ through which the incident light has passed. In an embodiment, the thickness d of the HSQ may be adjusted to achieve a 180° phase-shift of incident light.

In step S106, electron beam direct writing exposure is performed on the HSQ. Then, developing and fixing are performed to obtain a plurality of grating line patterns and a ring pattern surrounding the grating line patterns. The HSQ changes, after being subjected to electron beam direct writing, to a quasi-quartz structure, which has many excellent characteristics such as high resolution, small edge roughness, and good mechanical performance, etc. The grating line patterns may have a duty cycle of 1:3.

In step S108, a chrome material is deposited on the front surface of the silicon-based substrate through magnetron sputtering as a light-blocking layer for the grating line patterns and the ring pattern. In order to remove the chrome material inside the ring pattern through futon-dolan process in the following step, the chrome material has a thickness less than or equivalent to that of the HSQ. Otherwise the chrome material inside the ring pattern and that outside the ring pattern will adjoin each other, so that the chrome material inside the ring pattern cannot be removed effectively.

In step S110, the chrome material inside the ring pattern is removed through the futon-dolan process. The futon-dolan process was proposed by two scientists, T. A. Futon and G. J. Dolan, of Bell Lab in 1983. It is a controllable selective electrochemical etching method. In the process, the chrome material and a copper plate are immersed together into a chrome-removing solution. The chrome material contacting the copper plate is removed much slower than the chrome material that does not contact the copper plate. In this way, the chrome can be removed selectively. In step S108, the chrome material inside the ring pattern is separated from that outside the ring pattern by the ring pattern. When the chrome material is immersed in a chrome-removing solution together with a copper plate with the chrome material outside the ring pattern contacting the copper plate, the chrome material outside the ring pattern is retained as an absorber of scattering light. The chrome material inside the ring pattern, including the chrome material between and on the grating line patterns, is removed because it is separated from the chrome material outside the ring pattern and thus is not in contact with the copper plate.

In step S112, gold material is grown on the front surface of the silicon-based substrate through atomic layer deposition to achieve a thickness equivalent to the width of each grating line pattern. The grating line patterns initially have a duty cycle of 1:3. If the width of each grating line pattern is denoted as "1", the spacing between the grating line patterns is denoted as "3". The thickness of the gold material grown at opposite sidewalls of the grating line patterns is the same as the width of the grating line pattern. Thus, the spacing is reduced to "1", which is the same as the width of the grating line pattern. The structure obtained can thus implement phase modulation of the incident light.

In step S114, the gold material on the chrome material outside the ring pattern, between the grating line patterns, and on the grating line patterns are removed by reactive ion anisotropic etching, thereby only retaining the gold material on sidewalls of the grating line patterns. In this way, the sub-wavelength extreme ultraviolet metal transmission grating is obtained.

Figure 4:
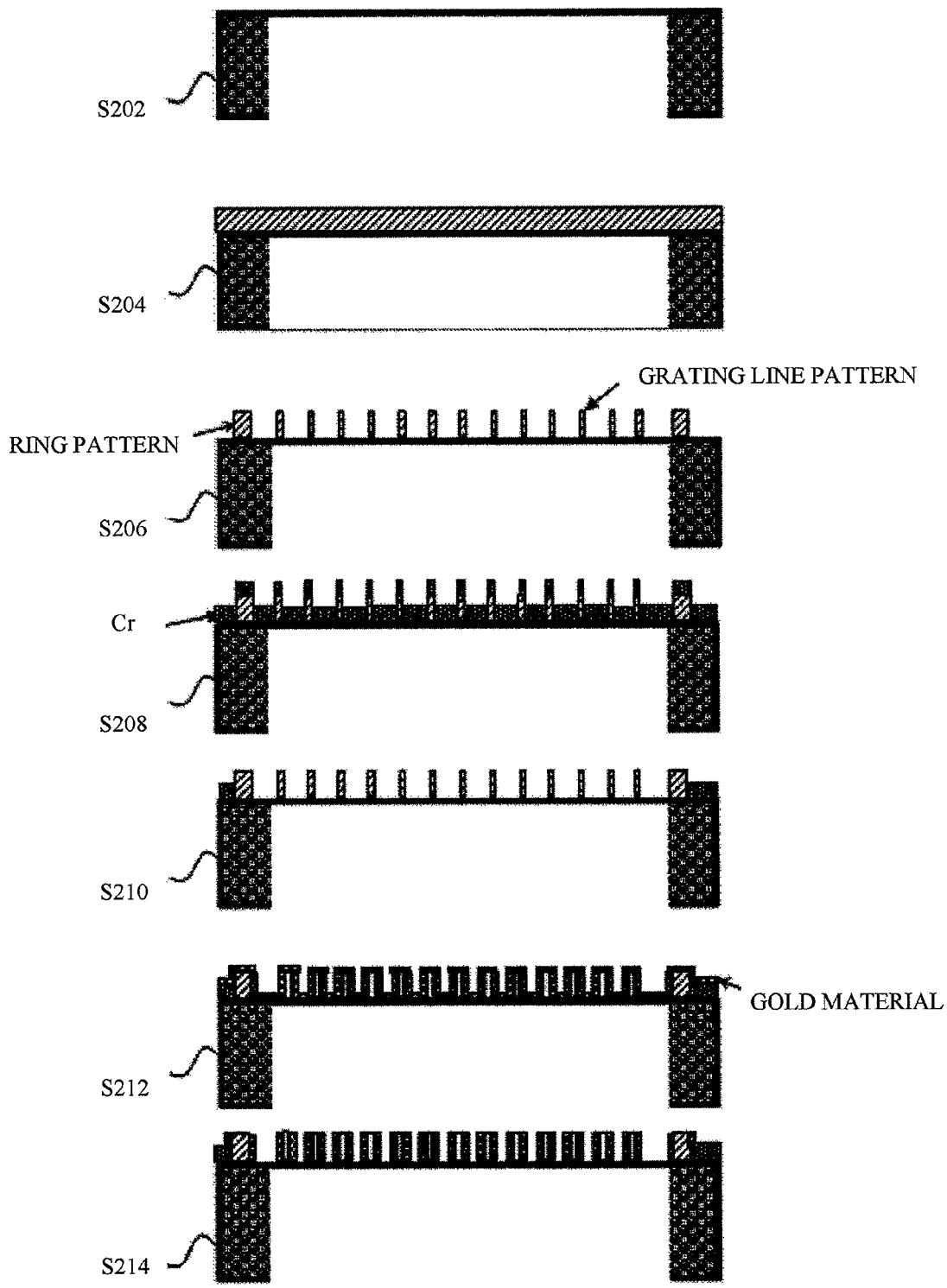
FIG. 4 schematically shows a process flow diagram of a method for manufacturing a sub-wavelength extreme ultraviolet metal transmission grating according to an embodiment of the disclosed technology.

FIG. 4 schematically shows a process flow diagram of a method for manufacturing a sub-wavelength extreme ultraviolet metal transmission grating according to an embodiment of the disclosed technology. The process comprises the following steps.

In step S202, a silicon nitride film having a thickness of 0.8 μm-1 μm is grown through plasma enhanced chemical vapor deposition on each of a front surface and a back surface of a silicon-based substrate having both surfaces cleansed and polished. The silicon nitride film on the back surface of the silicon-based substrate is etched using reactive ion etching until the silicon-based substrate is exposed so as to form a window. The silicon inside the window is etched through anisotropic etching by KOH solution until the silicon nitride film on the front surface of the silicon-based substrate is exposed so as to form a silicon nitride self-supporting film window.

In step S204, an electron beam resist HSQ is spin-coated on the silicon nitride film on the front surface of the silicon-based substrate. The HSQ may have a thickness of 25-40 nm to implement a 180° phase-shift of the incident light. Then, pre-baking is performed.

In step S206, electron beam direct writing exposure is performed on the HSQ. Then, developing and fixing are performed to obtain a plurality of grating line patterns and a ring pattern surrounding the grating line patterns. The grating line patterns may have a period of 80 nm. Each grating line pattern may have a width of 20 nm. The ring pattern may have a width of 100 nm.

In step S208, a chrome material is deposited through magnetron sputtering on the front surface of the silicon-based substrate outside the ring pattern, between the grating line patterns, and on the grating line patterns. The chrome material may have a thickness of 20 nm, which is less than or equivalent to that of the HSQ.

In step S210, the chrome material inside the ring pattern, including the chrome material between and on the grating line patterns, is removed by futon-dolan process. Only the chrome material outside the ring pattern is retained as an absorber of scattering light around the grating pattern.

In step S212, a gold material is deposited on the front surface of the silicon-based substrate on the chrome material outside the ring pattern, on sidewalls of the grating line patterns, as well as between and on the grating line patterns. The gold material may have a thickness of 20 nm and is used as an absorber of extreme ultraviolet light. The gold material may have a thickness equivalent to the width of the grating line pattern.

In step S214, the gold material on the chrome material outside the ring pattern as well as between and on the grating line patterns is removed in such a way that only the gold material on the sidewalls of the grating line patterns is retained. In this way, the sub-wavelength extreme ultraviolet metal transmission grating is obtained.

The objects, solutions, and advantages of the disclosed technology have been described in detail in connection with the foregoing specific embodiments. It should be noted that the foregoing only illustrates exemplary embodiments of the disclosed technology. However, the scope of the disclosed technology is not limited thereto. Any modification, substitution, or improvement will fall within the scope of the disclosed technology without departing from the spirit and principle thereof.

What is claimed is:

1. A method of manufacturing a sub-wavelength extreme ultraviolet metal transmission grating, comprising:
    forming a silicon nitride self-supporting film window on a back surface of a silicon-based substrate having both surfaces polished;
    spin-coating a silicon nitride film on a front surface of the silicon-based substrate with an electron beam resist (HSQ);
    performing electron beam direct writing exposure on the HSQ, and then performing developing and fixing to form a plurality of grating line patterns having a duty cycle of 1:3 and a ring pattern surrounding the grating line patterns;
    depositing a chrome material on the front surface of the silicon-based substrate through magnetron sputtering as a light-blocking layer for the grating line patterns and the ring pattern;
    removing the chrome material inside the ring pattern so that only the chrome material outside the ring pattern is retained as a absorber of scattering light;
    growing a gold material on the front surface of the silicon-based substrate through atomic layer deposition; and
    removing the gold material on the chrome material outside the ring pattern, between the grating line patterns, and on the grating line patterns so that only the gold material on sidewalls of the grating line patterns is retained.

2. The method of manufacturing the sub-wavelength extreme ultraviolet metal transmission grating according to claim 1, wherein forming the silicon nitride self-supporting film window on the back surface of the silicon-based substrate having both surfaces polished comprises:
    growing a silicon nitride film on each of the front surface and the back surface of the silicon-based substrate;
    forming a window by etching the silicon nitride film on the front back surface of the silicon-based substrate until the silicon-based substrate is exposed; and
    forming the silicon nitride self-supporting film window by anisotropic etching of silicon inside the window from the exposed silicon-based substrate until the silicon nitride film on the front surface of the silicon-based substrate is exposed.

3. The method of manufacturing the sub-wavelength extreme ultraviolet metal transmission grating according to claim 2, wherein:
    the silicon film is grown through plasma enhanced chemical vapor deposition; and
    the silicon nitride film has a thickness of 0.8 µm-1 µm.

4. The method of manufacturing the sub-wavelength extreme ultraviolet metal transmission grating according to claim 2, wherein the silicon nitride film is etched by reactive ion etching.

5. The method of manufacturing the sub-wavelength extreme ultraviolet metal transmission grating according to claim 2, wherein the silicon inside the window is etched by KOH solution.

6. The method of manufacturing the sub-wavelength extreme ultraviolet metal transmission grating according to claim 1, wherein the HSQ has a thickness of 25 nm-40 nm.

7. The method of manufacturing the sub-wavelength extreme ultraviolet metal transmission grating according to claim 1, wherein the HSQ changes to a quasi-quartz structure after being subjected to the electron beam direct writing exposure.

8. The method of manufacturing the sub-wavelength extreme ultraviolet metal transmission grating according to claim 1, wherein:
    the grating line patterns have a period of 80 nm, each grating line pattern having a width of 20 nm, and
    the ring pattern has a width of 100 nm.

9. The method of manufacturing the sub-wavelength extreme ultraviolet metal transmission grating according to claim 1, wherein the chrome material has a thickness less than or equivalent to that of the HSQ.

10. The method of manufacturing the sub-wavelength extreme ultraviolet metal transmission grating according to claim 1, wherein:
    the chrome material inside the ring pattern is removed through futon-dolan process; and
    removing the chrome material comprises removing the chrome material on and between the grating line patterns.

11. The method of manufacturing the sub-wavelength extreme ultraviolet metal transmission grating according to claim 1, wherein the gold material has a thickness equivalent to a width of the grating line pattern.

12. The method of manufacturing the sub-wavelength extreme ultraviolet metal transmission grating according to claim 1, wherein the chrome material is removed through reactive ion anisotropic etching.

13. A sub-wavelength extreme ultraviolet metal transmission grating, comprising:
    a silicon-based substrate;
    a silicon nitride self-supporting film window supported by the silicon-based substrate at the edge of the silicon based substrate;
    a plurality of grating line patterns having a duty cycle of 1:3 and being configured for phase modulation of incident light and a ring pattern surrounding the plurality of grating line patterns, the plurality of grating line patterns and the ring pattern being arranged on the silicon nitride self-supporting film window;
    a gold material for amplitude modulation of the incident light formed on the silicon nitride self-supporting film window and arranged on respective sidewalls of the grating line patterns and the ring pattern; and
    a chrome material arranged outside the ring pattern on the silicon nitride self-supporting film window.

14. The sub-wavelength extreme ultraviolet metal transmission grating according to claim 13, wherein the silicon nitride self-supporting film window is formed by:
    growing a silicon nitride film on each of a front surface and a back surface of the silicon-based substrate;
    forming a window by etching the silicon nitride film on the back surface of the silicon-based substrate until the silicon-based substrate is exposed;
    forming the silicon nitride self-supporting film window by anisotropic etching of silicon inside the window from the exposed silicon based substrate until the silicon nitride film on the front surface of the silicon-based substrate is exposed.

15. The sub-wavelength extreme ultraviolet metal transmission grating according to claim 14, wherein the silicon nitride has a thickness of 0.8 µm-1 µm.

16. The sub-wavelength extreme ultraviolet metal transmission grating according to claim 13, wherein the plurality of grating line patterns and the ring pattern surrounding the plurality of grating line patterns are formed by:
spin-coating the silicon nitride film on the front surface of the silicon-based substrate with an electron beam resist HSQ; and
performing electron beam direct writing exposure on the HSQ and then performing developing and fixing.

17. The sub-wavelength extreme ultraviolet metal transmission grating according to claim 16, wherein:
the HSQ has a thickness of 25 nm-40 nm;
the grating line patterns have a period of 80 nm, each grating line pattern having a width of 20 nm, and
the ring pattern has a width of 100 nm.

18. The sub-wavelength extreme ultraviolet metal transmission grating according to claim 13, wherein the chrome material has a thickness less than or equivalent to that of the HSQ.

19. The sub-wavelength extreme ultraviolet metal transmission grating according to claim 13, wherein the gold material has a thickness equivalent to the width of the grating line pattern.

* * * * *